United States Patent
Kuang et al.

(10) Patent No.: US 12,266,538 B2
(45) Date of Patent: Apr. 1, 2025

(54) METHOD FOR MANUFACTURING SEMICONDUCTOR DEVICE USING ETCHANT COMPOSITION HAVING HIGH ETCHING SELECTIVITY

(71) Applicant: TAIWAN SEMICONDUCTOR MANUFACTURING COMPANY, LTD., Hsinchu (TW)

(72) Inventors: Chia-Chien Kuang, Hsinchu (TW); Fang-Wei Lee, Hsinchu (TW); Meng-Huan Jao, Hsinchu (TW); Huan-Chieh Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 523 days.

(21) Appl. No.: 17/674,158

(22) Filed: Feb. 17, 2022

(65) Prior Publication Data

US 2023/0260797 A1  Aug. 17, 2023

(51) Int. Cl.

| | |
|---|---|
| *H01L 21/311* | (2006.01) |
| *C09K 13/06* | (2006.01) |
| *H01L 21/02* | (2006.01) |
| *H01L 21/8238* | (2006.01) |
| *H01L 29/40* | (2006.01) |
| *H01L 21/768* | (2006.01) |
| *H01L 29/417* | (2006.01) |
| *H01L 29/423* | (2006.01) |

(52) U.S. Cl.
CPC ........ *H01L 21/31116* (2013.01); *C09K 13/06* (2013.01); *H01L 21/02164* (2013.01); *H01L 21/823871* (2013.01); *H01L 29/401* (2013.01); *H01L 21/76897* (2013.01); *H01L 29/41733* (2013.01); *H01L 29/41783* (2013.01); *H01L 29/42392* (2013.01)

(58) Field of Classification Search
None
See application file for complete search history.

(56) References Cited

U.S. PATENT DOCUMENTS

| | | | |
|---|---|---|---|
| 2020/0126798 A1* | 4/2020 | Lin | H01L 29/78618 |
| 2020/0126805 A1* | 4/2020 | Bi | H01L 21/02334 |

* cited by examiner

*Primary Examiner* — Roberts P Culbert
(74) *Attorney, Agent, or Firm* — Birch, Stewart, Kolasch & Birch, LLP

(57) ABSTRACT

A method for manufacturing a semiconductor device includes:
forming a feature in a dielectric layer disposed on a semiconductor substrate, the dielectric layer including silicon oxide, the feature extending downwardly from a top surface of the dielectric layer and including silicon, a nitride compound, a low-k dielectric material other than silicon oxide, or combinations thereof; and
selectively etching the dielectric layer using an etchant composition to form a trench extending downwardly from the top surface of the dielectric layer, the etchant composition including a hydrogen halide and a nitrogen-containing compound represented by Formula (A),

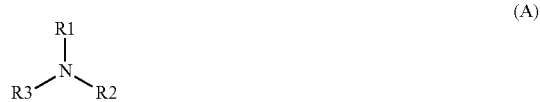

wherein
R1, R2, R3 are each independently hydrogen, methyl, or ethyl.

20 Claims, 12 Drawing Sheets

METHOD FOR MANUFACTURING SEMICONDUCTOR DEVICE USING ETCHANT COMPOSITION HAVING HIGH ETCHING SELECTIVITY

BACKGROUND

In a method for manufacturing a semiconductor device, such as an N3 (i.e., 3 nm process) or sub-N3 manufacturing method, an interconnect structure (for example, a via contact) is formed for electrically interconnecting a feature (for example, a source/drain region) and a metal line in a metal layer so as to reduce resistivity and boost electron mobility.

Prior to deposition of a metal material to form the interconnect structure, an inter-layer dielectric (ILD) layer is required to be etched so as to form a trench for filling the metal material therein by deposition. A plasma etching process is a common approach utilized to form the trench. Alternatively, it is desirable to provide a plasma-less etching process for forming the trench. The trench is usually formed proximate to a feature such as a self-aligned contact (SAC), which protects a metal gate (MG) and a cap layer (for example, a fluorine-free tungsten film) disposed on the MG from damage during an etching process. Therefore, the material of the SAC should have a relatively low etching selectivity with respect to that of the ILD layer when forming the trench in the ILD layer using an etchant, so as to prevent a contact-to-gate short. An etching selectivity of the SAC and/or a bottom contact etch stop layer (BCESL) with respect to the ILD layer is generally regarded as a major concern in the etching process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
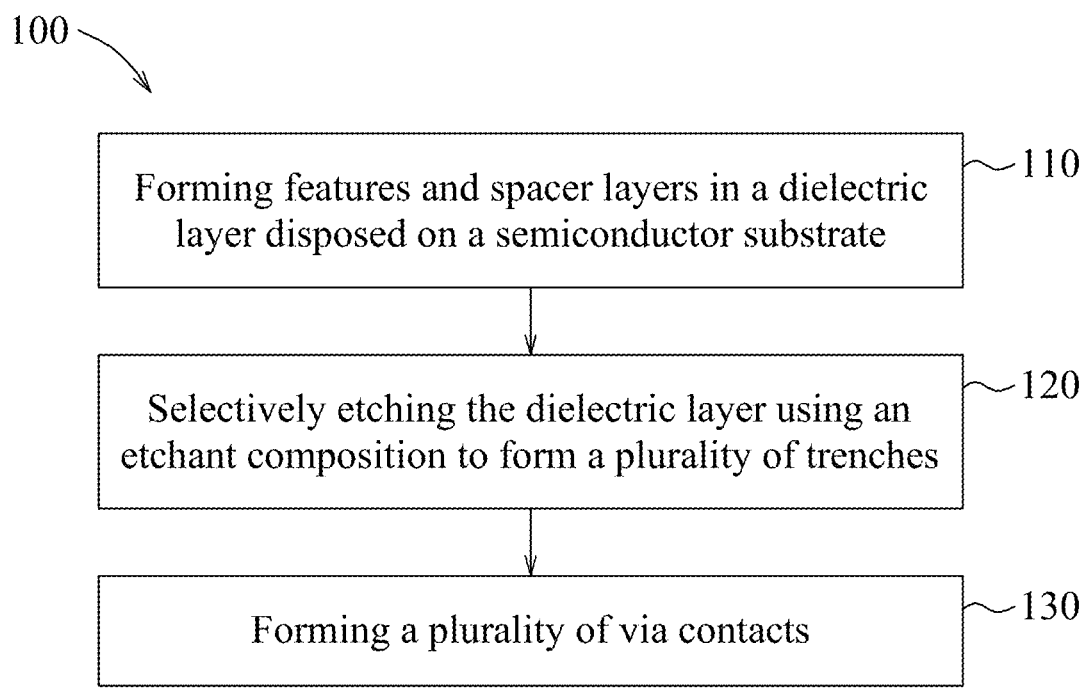
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
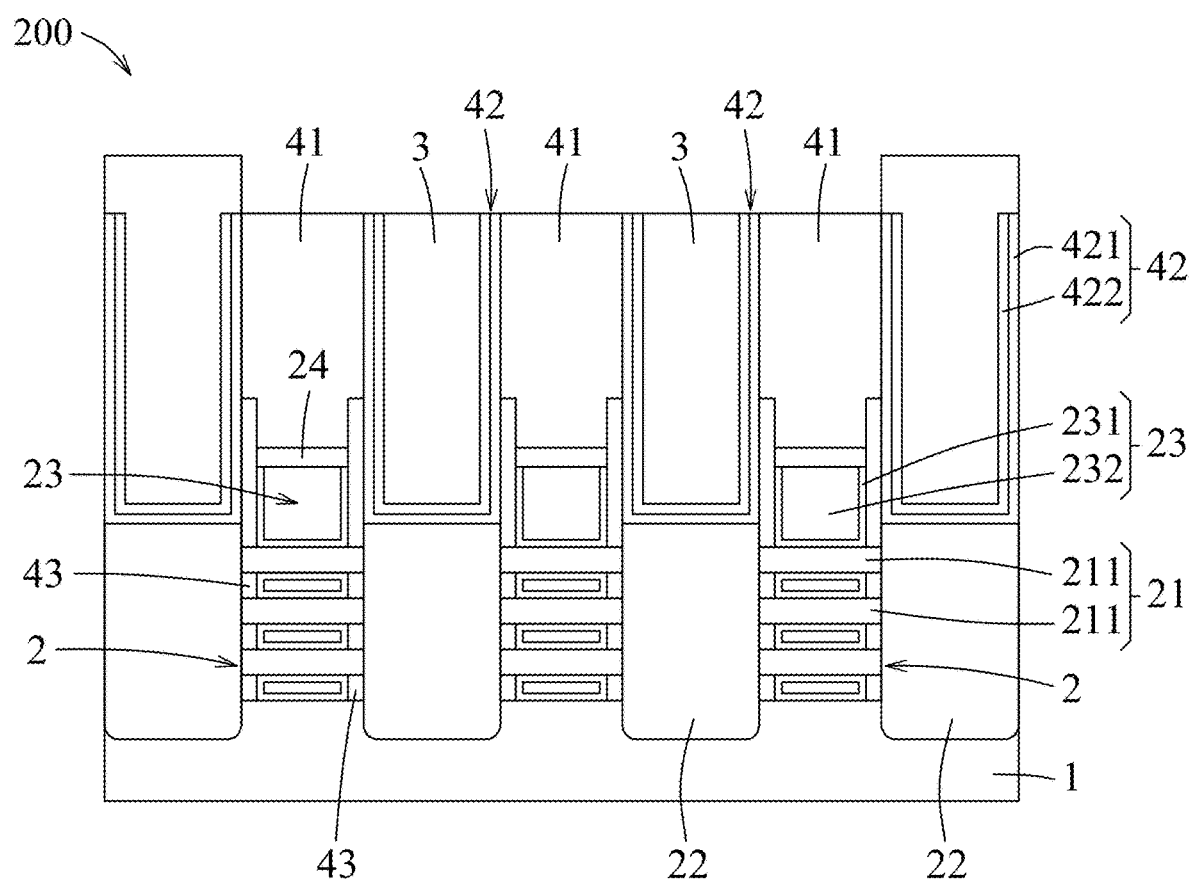
FIGS. 2 to 4 are schematic views illustrating intermediate stages of the manufacturing method as depicted in FIG. 1 in accordance with some embodiments.
Figure 3:
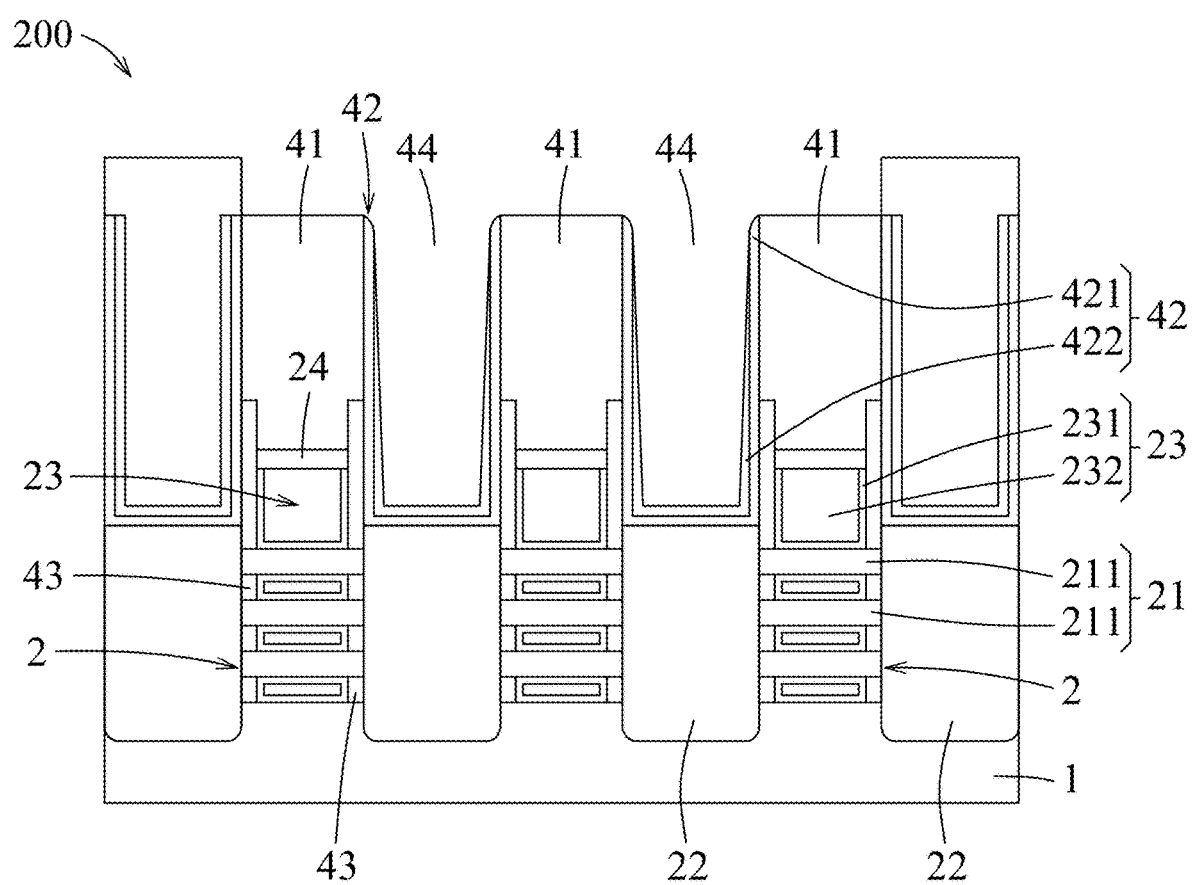
Figure 4:
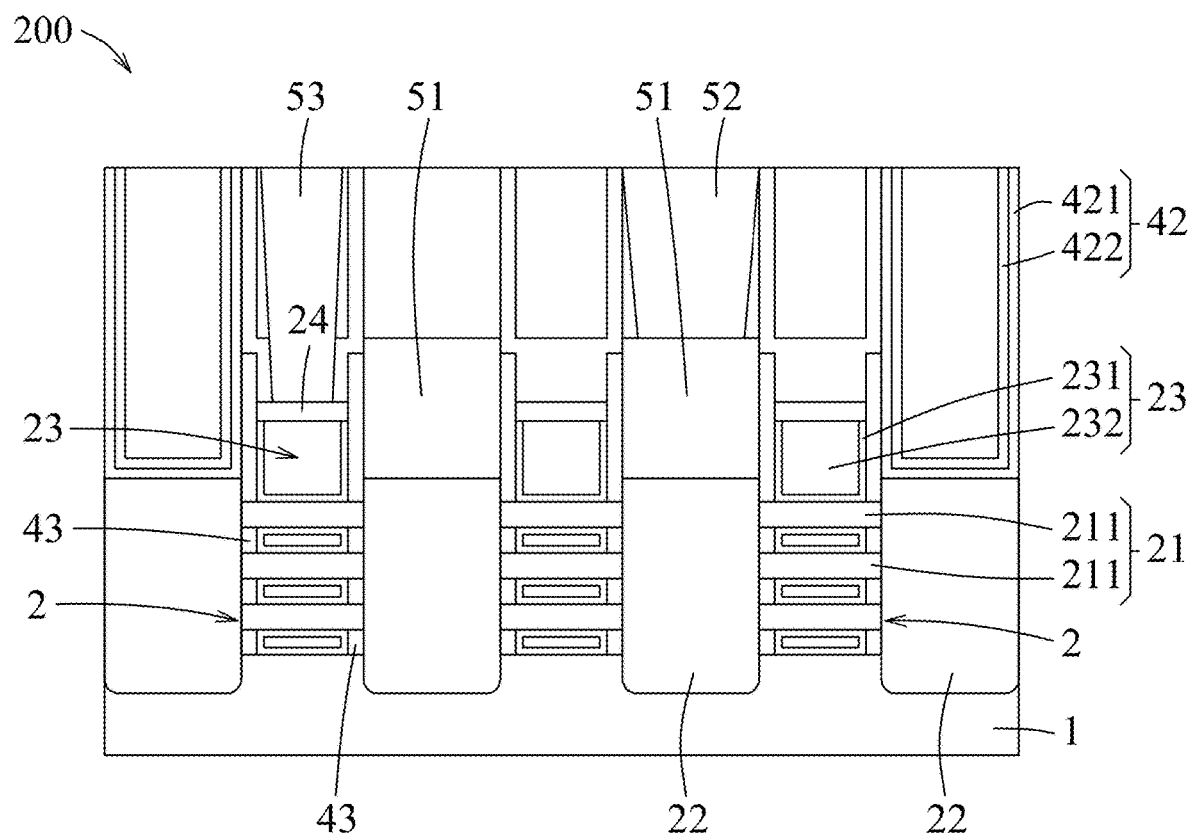

The present disclosure is directed to a method for manufacturing a semiconductor device and a semiconductor device obtained by the method. FIG. 1 is a flow diagram illustrating a method 100 for manufacturing a semiconductor device in accordance with some embodiments. FIGS. 2 to 4 illustrate schematic views of a semiconductor device 200 during various stages of the method 100 shown in FIG. 1. The method 100 and the semiconductor device 200 are collectively described below. However, additional steps can be provided before, after or during the various stages of the method 100, and some of the steps described herein may be replaced by other steps or be eliminated. Similarly, additional features may be present in the semiconductor device 200, and/or the features presented herein may be replaced or eliminated in additional embodiments.

Referring to FIG. 1, the method 100 begins at block 110, where features and spacer layers are formed in a dielectric layer disposed on a semiconductor substrate. A semiconductor device 200 having a configuration illustrated in FIG. 2 is formed, in which features (for example, but not limited to, self-aligned contacts (SACs) 41) and spacer layers 42 (for example, but not limited to, bottom contact etch stop layers (BCESL)) are formed in an inter-layer dielectric (ILD) layer 3. Referring to the example illustrated in FIG. 2, the semiconductor device 200 includes a semiconductor substrate 1, a plurality of nanosheet field effect transistors (FETs) 2 disposed on the semiconductor substrate 1, the ILD layer 3 disposed on the semiconductor substrate 1 to cover the nanosheet FETs 2, a plurality of SACs 41 disposed on the nanosheet FETs 2, respectively, and a plurality of spacer layers 42.

The semiconductor substrate 1 may be, for example, but not limited to, a silicon-on-insulator (SOI) substrate, a germanium-on-insulator (GOI) substrate, a bulk semiconductor substrate, or the like, and may be doped with a dopant. The semiconductor substrate 1 may have multiple layers. The semiconductor substrate 1 may include elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. Other materials suitable for the semiconductor substrate 1 are within the contemplated scope of the disclosure.

Each of the nanosheet FETs 2 includes a channel region 21, a pair of source/drain regions 22, and a gate structure 23. The channel region 21 includes a plurality of nanosheets 211 (for example, but not limited to, silicon nanosheets). In some embodiments, the width of the nanosheets 211 may range from about 10 nanometers (nm) to about 15 nm in some areas, and may range from about 100 nm to about 120 nm in some other areas. Each pair of the source/drain regions 22 are disposed on the semiconductor substrate 1 and at opposite sides of the channel region 21. In some embodiments, the width of each of the source/drain regions 22 may range from about 15 nm to about 25 nm in some areas and may range from about 25 nm to about 35 nm in some other areas. In some embodiments, the height of the source/drain regions 22 may range from about 35 nm to about 45 nm. The source/drain regions 22 are formed by growing an epitaxial layer along the nanosheets 211 of the channel regions 21. In addition, the source/drain regions 22 may be doped with germanium (Ge), boron (B), phosphorus (P), or arsenic (As). For example, in some embodiments, the epitaxial layer is grown along the nanosheets 211 of the channel regions 21 through an epitaxial growth process with, for example, phosphorus doping when the source/drain regions 22 to be formed are n-FET source/drain regions. In some embodiments, the epitaxial layer is grown along the nanosheets 211 of the channel regions 21 through an epitaxial growth process with, for example, germanium doping when the source/drain regions 22 to be formed are p-FET source/drain regions.

The gate structure 23 includes an upper gate portion disposed over the channel region 21, and a lower gate portion surrounding the nanosheets 211 of the channel region 21. The gate structure 23 includes a gate dielectric layer 231 and a metal filling layer 232 surrounded by the gate dielectric layer 231. The gate dielectric layer 231 may include a high-k dielectric material, such as $HfO_2$, HfSiO, HfSiON, HfTaO, HfTiO, HfZrO, other suitable high-k dielectric materials, or combinations thereof. The metal filling layer 232 may include a barrier sub-layer, a work function sub-layer, and a filling material sub-layer. The barrier sub-layer may prevent diffusion of metal into the gate dielectric layer 231. Examples of a material suitable for the work function sub-layer may include titanium, aluminum, tantalum carbide, tantalum carbide nitride, tantalum silicon nitride, and combinations thereof, but are not limited thereto. Examples of a material suitable for the filling material sub-layer may include aluminum, tungsten, copper, and other conductive metals, but are not limited thereto.

In some embodiments, the ILD layer 3 is made of a dielectric material including silicon oxide. In some embodiments, the ILD layer 3 is made of silicon oxide. In some embodiments, the height of the ILD layer 3 may range from about 55 nm to about 65 nm. In some embodiments, a total height of the ILD layer 3 and the source/drain regions 22 may range from about 105 nm to about 125 nm.

In some embodiments, the SACs 41 includes silicon, a nitride compound, a low-k dielectric material other than silicon oxide, or combinations thereof. In some embodiments, the SACs 41 include silicon, silicon nitride, silicon nitride doped with carbon, silicon oxynitride, silicon oxynitride doped with carbon, amorphous carbon material, silicon carbide, other nitride materials, other carbide materials, aluminum oxide, other metal oxides, boron nitride, boron carbide, and other low-k dielectric materials or low-k dielectric materials doped with one or more of carbon, nitrogen, and hydrogen, or other suitable materials.

Each of the spacer layers 42 is configured to include a base portion, and a wall portion extending downwardly from a top surface of the ILD layer 3 to terminate at a periphery of the base portion. The wall portion of each of the spacer layers 42 is disposed between the ILD layer 3 and corresponding ones of the SACs 41. In some embodiments, each of the spacer layers 42 includes an outer spacer sub-layer 421 covering a lateral wall of corresponding ones of the SACs 41 and a top surface of a corresponding one of the source/drain regions 22, and an inner spacer sub-layer 422 conformally formed on the outer spacer sub-layer 421. In some embodiments, the inner and outer spacer sub-layers 422, 421 may independently include a nitride compound, a low-k dielectric material other than silicon oxide, or a combination thereof. In some embodiments, the inner and outer spacer sub-layers 422 and 421 may independently include silicon nitride, silicon nitride doped with carbon, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials.

The semiconductor device 200 further includes inner spacers 43 laterally covering the gate structures 23 of the nanosheet FETs 2. Examples of a material suitable for forming the inner spacers 43 may include silicon oxide, silicon nitride, silicon carbide, silicon oxycarbide, silicon oxynitride, silicon carbonitride, silicon oxycarbonitride, and combinations thereof, but are not limited thereto.

Referring to FIG. 1, the method 100 then proceeds to block 120, where the dielectric layer is selectively etched using an etchant composition to form a plurality of trenches. Referring to the examples illustrated in FIGS. 2 and 3, the ILD layer 3 is selectively etched using an etchant composition to form trenches 44 extending downwardly from the top surface of the ILD layer 3. The etchant composition includes a hydrogen halide and a nitrogen-containing compound represented by Formula (A):

wherein
R1, R2, R3 are each independently hydrogen, methyl, or ethyl.

In some embodiments, the hydrogen halide includes hydrogen fluoride, hydrogen chloride, hydrogen bromide, hydrogen iodide, or combinations thereof. In some embodiments, the nitrogen-containing compound includes ammonia, methyl amine, dimethyl amine, trimethyl amine, ethyl amine, diethyl amine, triethyl amine, methyl ethyl amine, methyl diethyl amine, dimethyl ethyl amine, or combinations thereof.

In some embodiments, the etchant composition has an etching selectivity of the ILD layer 3 to the SACs 41 ranging from 10 to 100, so that loss of the SACs 41 may be reduced when the ILD layer 3 is selectively etched using the etchant composition and that the trenches 44 thus formed may have a relatively high aspect ratio in a range, for example, but not limited to, from about 2 to about 15. In some embodiments, the aspect ratio ranges from about 10 to about 15. In some embodiments, the etching selectivity of the ILD layer 3 to the SACs 41 ranges from 50 to 100. In some embodiments, the etchant composition has an etching selectivity of the ILD layer 3 to the spacer layers 42 ranging from 10 to 100, so that loss of the spacer layers 42 may be reduced when the ILD layer 3 is selectively etched using the etchant composition. In some embodiments, the etching selectivity of the ILD layer 3 to the spacer layers 42 ranges from 50 to 100. Selective etching of the ILD layer 3 is performed by an isotropic etching process.

Figure 5:
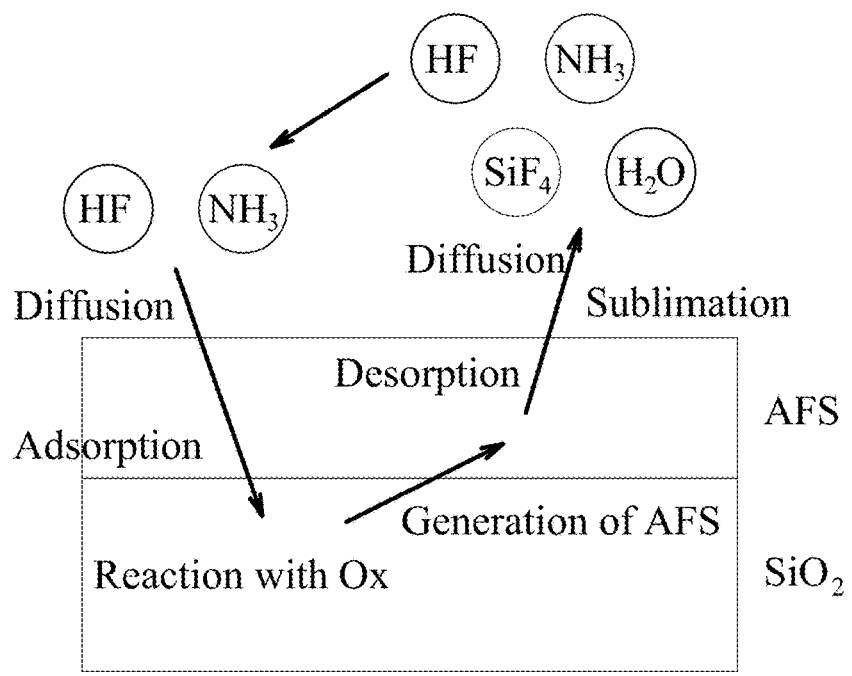
FIG. 5 is a schematic view illustrating a reaction mechanism for etching a silicon oxide dielectric layer using an etchant composition in the method as depicted in FIG. 1 in accordance with some embodiments.

FIG. 5 shows a schematic view illustrating a reaction mechanism for etching the ILD layer 3 made of a silicon oxide ($SiO_2$) dielectric layer using the etchant composition during a selective etching process of the method as depicted in FIG. 1 in accordance with some embodiments. In some embodiments, the etchant composition includes a hydrogen halide exemplified as hydrogen fluoride (HF), and a nitrogen-containing compound exemplified as ammonia ($NH_3$). The reaction mechanism for etching the ILD layer 3 made of the silicon oxide dielectric layer using the etchant composition is also illustrated below.

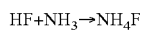

$HF + NH_3 \rightarrow NH_4F$

$4HF + 2NH_4F + SiO_2 \rightarrow (NH_4)_2SiF_6 \text{ (salt)} + 2H_2O\uparrow$

$(NH_4)_2SiF_6 \rightarrow 2NH_3\uparrow + 2HF\uparrow + SiF_4\uparrow$

As shown in FIG. 5 and the illustration above, hydrogen fluoride (HF) reacts with ammonia ($NH_3$) to form ammonium fluoride ($NH_4F$). Then, hydrogen fluoride, ammonium fluoride, and silicon oxide react with each other to form an ammonium hexafluorosilicate (($NH_4)_2SiF_6$ (AFS salt)) layer, which is deposited on the silicon oxide dielectric layer. Hydrogen fluoride, ammonia, and ammonium fluoride diffuse through the AFS salt layer to continuously react with silicon oxide to further form the AFS salt layer. The AFS salt layer may be removed by a cleaning process, which permits ammonium hexafluorosilicate to desorb and sublimate through decomposition of ammonium hexafluorosilicate into ammonia, hydrogen fluoride, and ammonium fluoride. In some embodiments, the cleaning process may be performed by annealing, purging, or a combination thereof, or the like. The selective etching process and the cleaning process may be performed alternately. That is, cycles of alternating the selective etching and the cleaning processes may be performed.

In some embodiments, the etchant composition may further include an inert diluent. In some embodiments, the inert diluent includes an inert gas, for example, but not limited to, argon, nitrogen, or the like, or combinations thereof.

Figure 6:
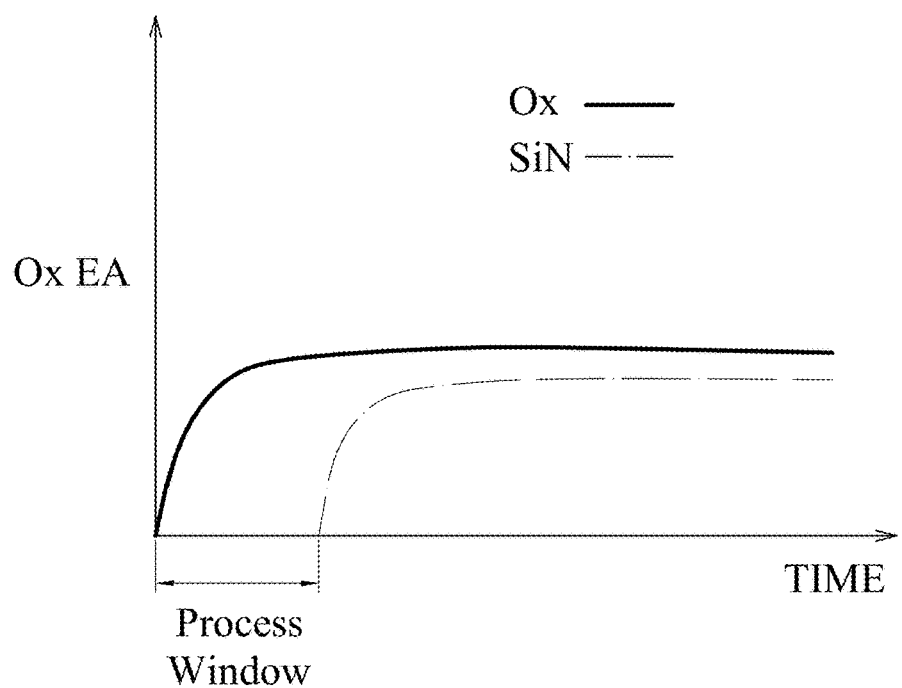
FIG. 6 is a graph plot illustrating relationships of etching amounts of silicon oxide and silicon nitride versus an etching time during a selective etching process in the method as depicted in FIG. 1 in accordance with some embodiments.

In some embodiments, the ILD layer 3 made of silicon oxide is selectively etched using the etchant composition at a temperature ranging from about 10° C. to about 45° C. FIG. 6 is a graph plot illustrating relationships of etching amounts of silicon oxide (the ILD layer 3 shown in FIG. 2) and silicon nitride (an example of the materials for the SACs 41 and the spacer layers 42 shown in FIG. 2) versus an etching time during the selective etching process in the method in accordance with the some embodiments. Since the etchant composition has an etching selectivity of the ILD layer 3 to the SACs 41 (and the spacer layers 42) ranging from 10 to 100, silicon oxide is first etched by the etchant composition for a time period (i.e., a process window) before silicon nitride is etched by the etchant composition. In the some embodiments, in which the selective etching process is performed at the temperature ranging from about 10° C. to about 45° C., the process window ranges from about 20 seconds to about 70 seconds. When each cycle of the selective etching process in the some embodiments is performed for a time period of less than 20 seconds, the amount of silicon oxide being etched in each cycle of the selective etching process is unsatisfactory. When each cycle of the selective etching process in the some embodiments is performed for a time period of greater than 70 seconds, silicon nitride may be also etched while etching silicon oxide, resulting in the etching selectivity of silicon oxide to silicon nitride (i.e., the ILD layer 3 to the SACs 41 (and the spacer layers 42) being undesirably reduced, which may cause loss and/or damage of the SACs 41 and the spacer layers 42, which may lead the circuit shortage between interconnect structures (for example, via contacts) to be formed subsequently and damage of the source/drain regions 22. In addition, as shown in FIG. 6, the etched silicon oxide may reach a saturated amount after a time period in each cycle of the selective etching process. Therefore, the cleaning process should be performed to remove ammonium hexafluorosilicate produced in each cycle of the selective etching process before a next cycle of the selective etching process is performed.

In the some embodiments, in which the selective etching process is performed at the temperature ranging from about 10° C. to about 45° C., the ILD layer 3 is selectively etched at a pressure ranging from about 0.3 Torr to about 3 Torr. When the pressure is less than 0.3 Torr, the flow rate of the etchant composition is too low, which may reduce the etching efficiency of the selective etching process. When the pressure is greater than 3 Torr, the SACs 41 and the spacer layers 42 may be lost and/or damaged during the selective etching process. The hydrogen halide is supplied at a flow rate ranging from about 5 sccm to about 120 sccm. When the flow rate of the hydrogen halide is less than 5 sccm, the etching efficiency of the selective etching process may be reduced. When the flow rate of the hydrogen halide is greater than 120 sccm, the SACs 41 and the spacer layers 42 may be lost and/or damaged during the selective etching process. The nitrogen-containing compound is supplied at a flow rate ranging from about 25 sccm to about 600 sccm. When the flow rate of the nitrogen-containing compound is less than 25 sccm, the etching efficiency of the selective etching process may be reduced. When the flow rate of the nitrogen-containing compound is greater than 600 sccm, the SACs 41 and the spacer layers 42 may be lost and/or damaged during the selective etching process. The inert diluent includes argon, and is supplied at a flow rate ranging from about 500 sccm to about 2500 sccm. When the flow rate of the inert diluent is less than 500 sccm, the flow rates of the hydrogen halide and/or the nitrogen-containing compound are too high, which may cause loss or damage of the SACs 41 and the spacer layers 42 during the selective etching process. When the flow rate of the inert diluent is greater than 2500 sccm, the flow rates of the hydrogen halide and/or the nitrogen-containing compound are too low, which may undesirably reduce the etching efficiency of the selective etching process.

Figure 13:
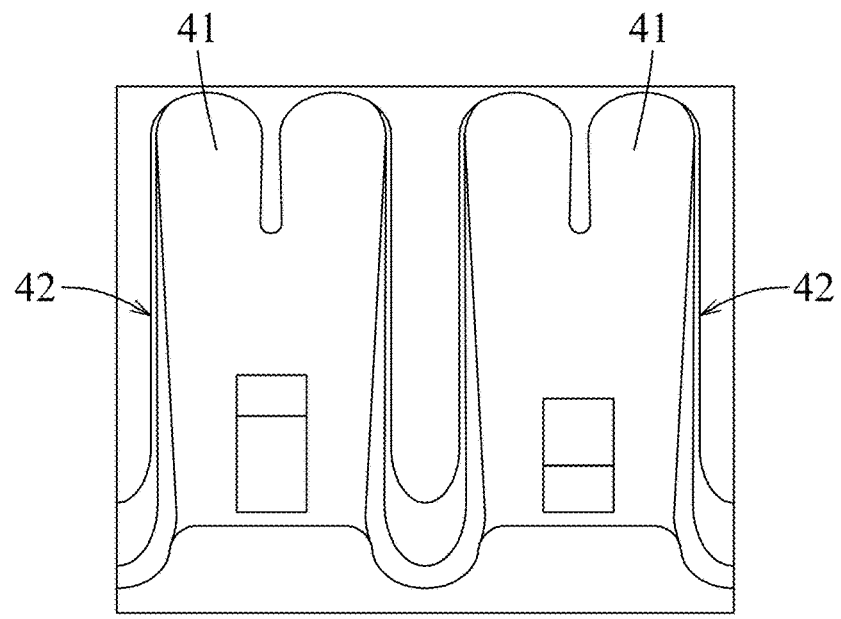
Figure 14:
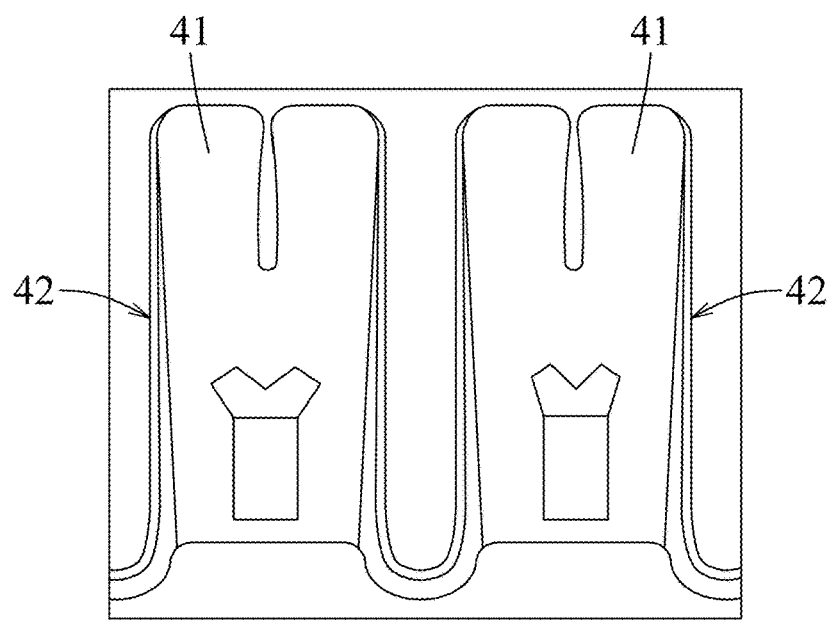
Figure 15:
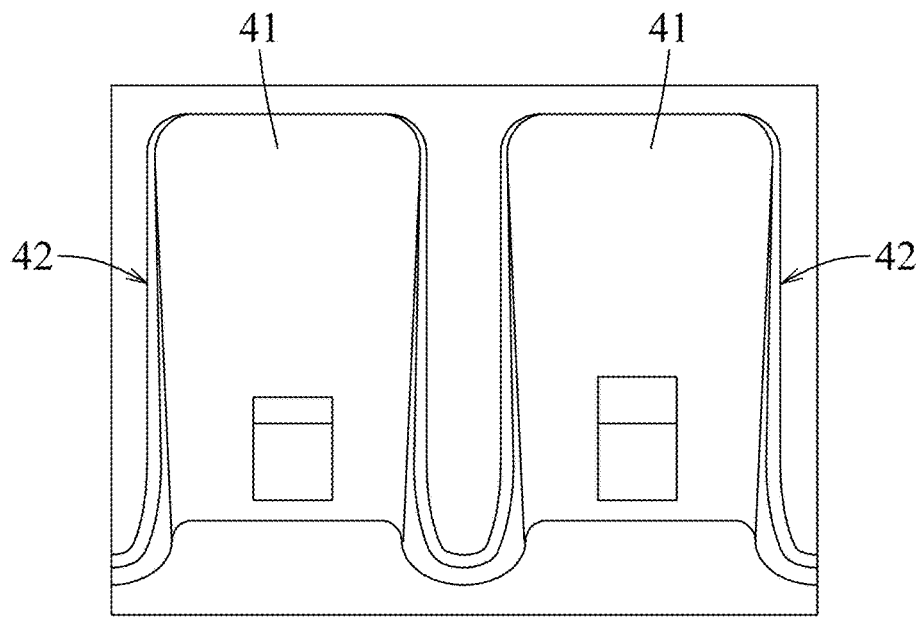
Figure 16:
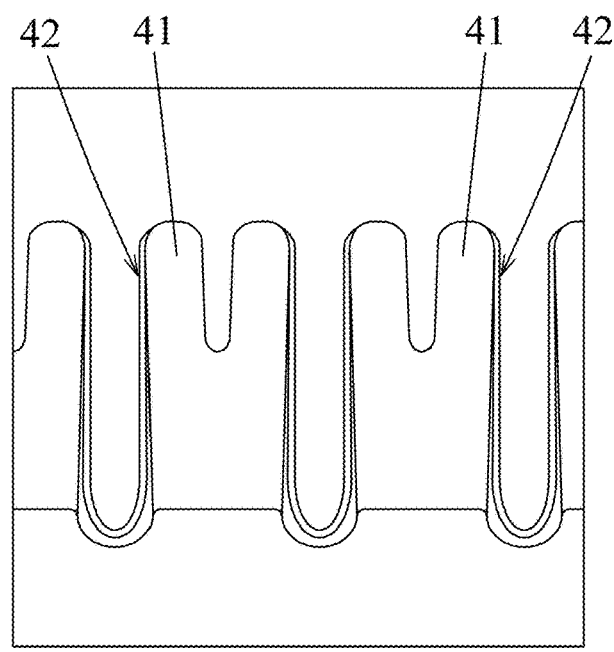
FIGS. 16 to 20 are fragmentary enlarged views of FIG. 3, illustrating intermediate stages of the method as depicted in FIG. 1 in accordance with some alternative embodiments.
Figure 17:
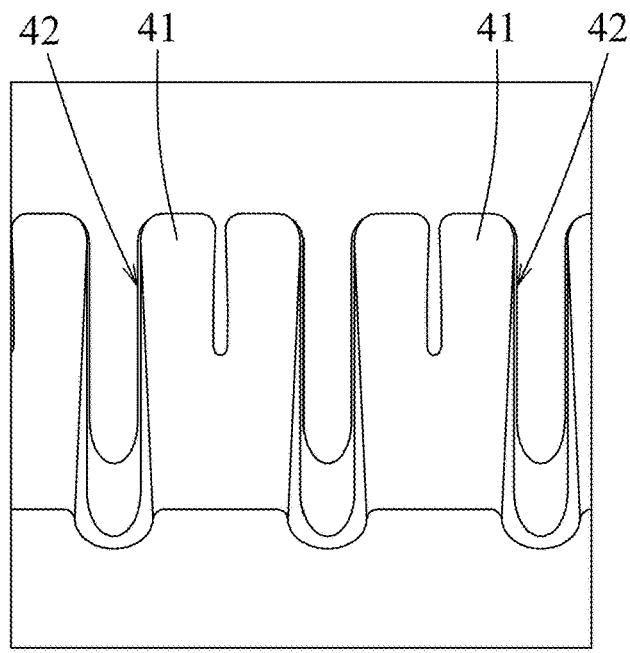

Each of FIGS. 11 to 15 illustrates a fragmentary enlarged view of the semiconductor device 200 shown in FIG. 3 in accordance with the some embodiments in which the selective etching process is performed at the temperature ranging from about 10° C. to about 45° C. When the method as depicted in FIG. 1 in accordance with the some embodiments is performed using operation conditions which includes an etching temperature ranging from about 40° C. to about 50° C., a flow rate of hydrogen halide ranging from about 5 sccm to about 40 sccm, a flow rate of the nitrogen-containing compound ranging from about 20 sccm to about 80 sccm, and an etching cycle ranging from about 20 seconds to about 30 seconds, the semiconductor devices 200 having the configurations shown in FIGS. 13 to 15 can be obtained. In comparison with the configurations shown in FIGS. 11 and 12, the loss and/or damage of the SACs 41 in the configurations shown in FIGS. 13 to 15 is relatively less, and the SACs 41 may even have a substantially intact configuration, as shown in FIG. 15.

Figure 7:
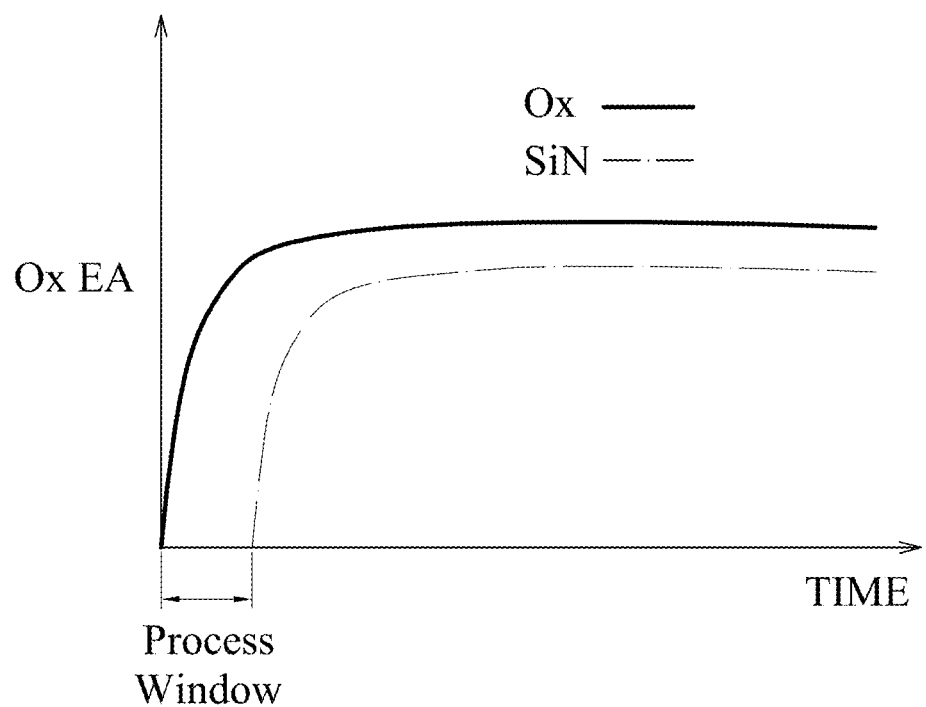
FIG. 7 is a graph plot illustrating relationships of etching amounts of silicon oxide and silicon nitride versus an etching time during a selective etching process in the method as depicted in FIG. 1 in accordance with some alternative embodiments.

In some alternative embodiments, the ILD layer 3 made of silicon oxide is selectively etched using the etchant composition at a temperature ranging from about 90° C. to about 120° C. FIG. 7 is a graph plot illustrating relationships of etching amounts of silicon oxide (the ILD layer 3 shown in FIG. 2) and silicon nitride (an example of the materials for the SACs 41 and the spacer layers 42 shown in FIG. 2) versus an etching time during a selective etching process in the method in accordance with the some alternative embodiments in which the selective etching process is performed at the temperature ranging from about 90° C. to about 120° C. Since the etchant composition has an etching selectivity of the ILD layer 3 to the SACs 41 (and the spacer layers 42) ranging from 10 to 100, silicon oxide is first etched by the etchant composition for a time period (i.e., a process window) before silicon nitride is etched by the etchant composition. In the some alternative embodiments, in which the selective etching process is performed at the temperature ranging from about 90° C. to about 120° C., the process window is narrower than that in the some embodiments in which the selective etching process is performed at the temperature ranging from about 10° C. to about 45° C., and ranges from about 2 seconds to about 5 seconds. This indicates that the selective etching process in the some alternative embodiments is performed more efficiently than that in the some embodiments. When each cycle of the selective etching process in the some alternative embodiments is performed for a time period of less than 2 seconds, the amount of silicon oxide being etched in each cycle of the selective etching process is unsatisfactory. When each cycle of the selective etching process in the some alternative embodiments is performed for a time period of greater than 5 seconds, silicon nitride may be also etched while etching silicon oxide, resulting in the etching selectivity of silicon oxide to silicon nitride (i.e., the ILD layer 3 to the SACs 41 (and the spacer layers 42) being undesirably reduced, which may cause loss and/or damage of the SACs 41 and the spacer layers 42, which may lead the circuit shortage between interconnect structures (for example, via contacts) to be formed subsequently and damage of the source/drain regions 22. In addition, as shown in FIG. 7, the etched silicon oxide may reach a saturated amount after a time period in each cycle of the selective etching process. Therefore, the cleaning process should be performed to remove ammonium hexafluorosilicate produced in each cycle of the selective etching process before a next cycle of the selective etching process is performed.

In the some alternative embodiments, in which the selective etching process is performed at the temperature ranging from about 90° C. to about 120° C., the ILD layer 3 is selectively etched at a pressure ranging from about 10 Torr to about 30 Torr. When the pressure is less than 10 Torr, the flow rate of the etchant composition is too low, which may reduce the etching efficiency of the selective etching process. When the pressure is greater than 30 Torr, the SACs 41 and the spacer layers 42 may be lost and/or damaged during the selective etching process. The hydrogen halide is supplied at a flow rate ranging from about 120 sccm to about 360 sccm. When the flow rate of the hydrogen halide is less than 120 sccm, the etching efficiency of the selective etching process may be reduced. When the flow rate of the hydrogen halide is greater than 360 sccm, the SACs 41 and the spacer layers 42 may be lost and/or damaged during the selective etching process. The nitrogen-containing compound is supplied at a flow rate ranging from about 60 sccm to about 240 sccm. When the flow rate of the nitrogen-containing compound is less than 60 sccm, the etching efficiency of the selective etching process may be reduced. When the flow rate of the nitrogen-containing compound is greater than 240 sccm, the SACs 41 and the spacer layers 42 may be lost and/or damaged during the selective etching process. The inert diluent includes a composition including argon and nitrogen, and is supplied at a flow rate ranging from about 9000 sccm to about 12000 sccm. When the flow rate of the inert diluent is less than 9000 sccm, the flow rates of the hydrogen halide and/or the nitrogen-containing compound is too high, which may cause loss and/or damage of the SACs 41 and the spacer layers 42 during the selective etching process. When the flow rate of the inert diluent is greater than 12000 sccm, the flow rates of the hydrogen halide and/or the nitrogen-containing compound is too low, which may undesirably reduce the etching efficiency of the selective etching process.

Figure 8:
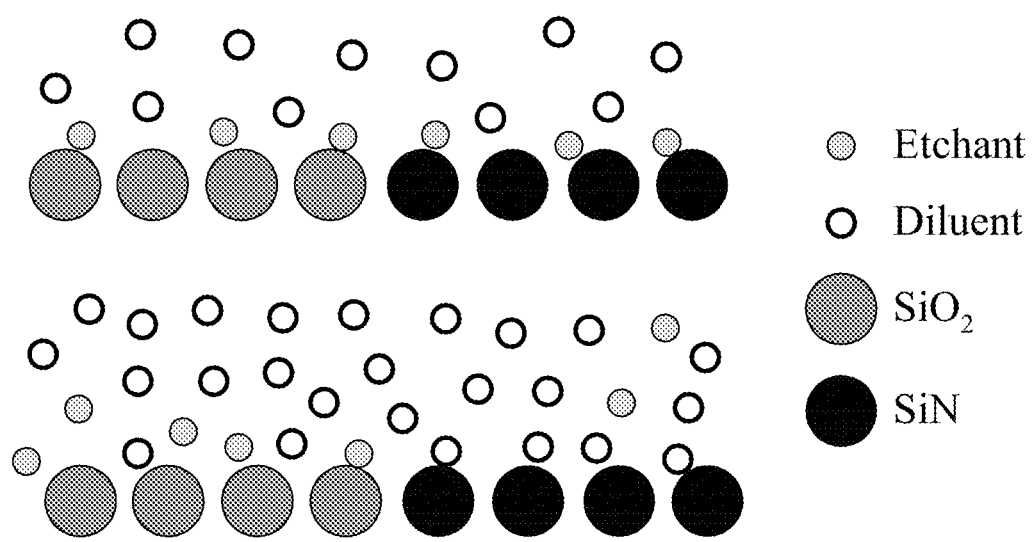
FIG. 8 is a schematic view illustrating competitive adsorption between an etchant and an inert diluent in the method as depicted in FIG. 1 in accordance with some embodiments.

Referring to FIG. 8, which is a schematic view illustrating competitive adsorption between an etchant and an inert diluent in the some alternative embodiments in which the selective etching process is performed at the temperature ranging from about 90° C. to about 120° C., when the amount of the etchant in the etchant composition is relatively low (i.e., the inert diluent is supplied at a relatively high flow rate in the range defined above), the etchant may be more easily to be selectively absorbed on silicon oxide, so that the etching efficiency of the selective etching process may be enhanced.

Figure 9:
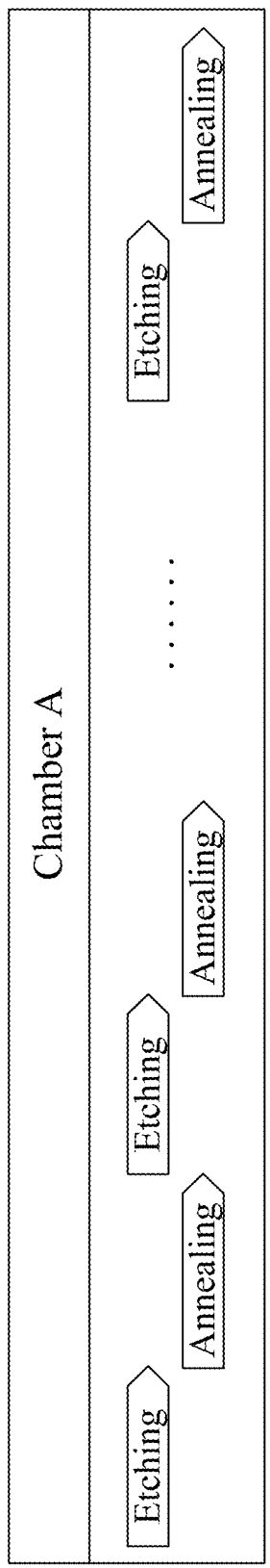
FIG. 9 is a schematic view illustrating the manufacturing method as depicted in FIG. 1 in accordance with some embodiments.

Referring to FIG. 9, which is a schematic view illustrating the manufacturing method in accordance with the some embodiments in which the selective etching process is performed at the temperature ranging from about 10° C. to about 45° C., cycles of alternating the selective etching process and the cleaning process as described above are performed. The cleaning process involves an annealing process performed at a temperature ranging from about 150° C. to about 225° C. When the annealing process is performed at a temperature lower than 150° C., the deposit (for example, but not limited to, the AFS salt) produced by the selective etching process may not be removed effectively. When the annealing process is performed at a temperature higher than 225° C., the semiconductor device may be damaged, or a relatively long cooling period is required to cool the semiconductor device to a proper temperature for a next cycle of the selective etching process. In some embodiments, the annealing process is performed in an atmosphere of hydrogen. Each cycle of the annealing process may be performed for a time period ranging from about 30 seconds to about 90 seconds. The selective etching process may be performed for about 15 cycles to about 35 cycles, and each cycle of the selective etching process may be performed for a time period (i.e., the process window) ranging from about 20 seconds to about 70 seconds, as described above. The selective etching process and the annealing process may be performed in a same chamber (i.e., chamber A).

Figure 10:
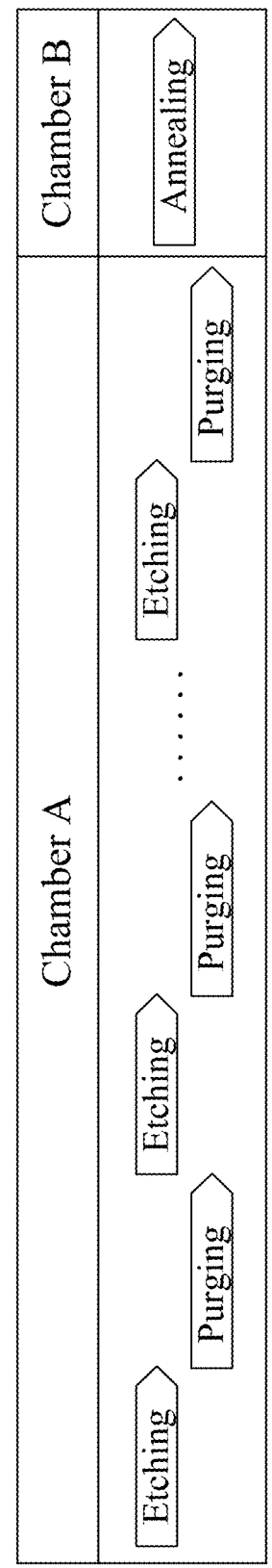
FIG. 10 is a schematic view illustrating the manufacturing method as depicted in FIG. 1 in accordance with some alternative embodiments.
Figure 11:
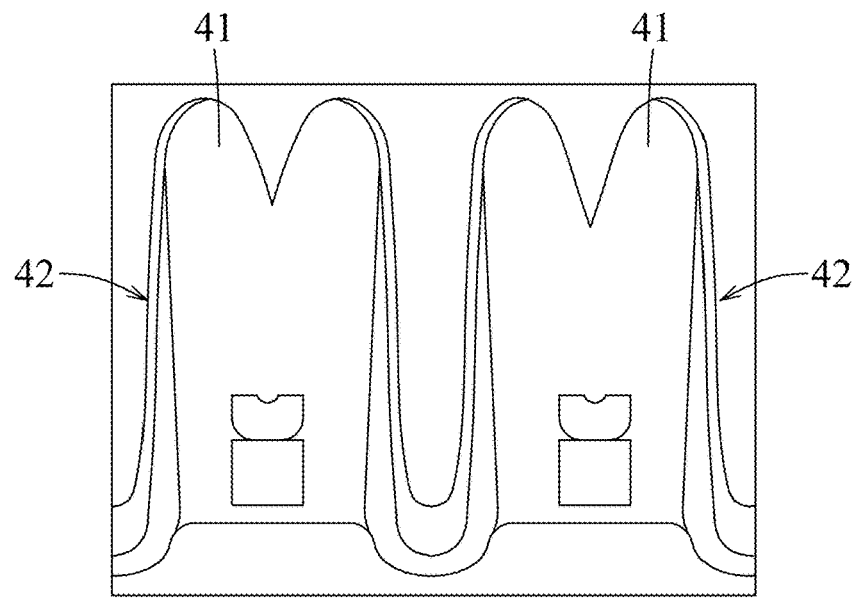
FIGS. 11 to 15 are fragmentary enlarged views of FIG. 3, illustrating intermediate stages of the method as depicted in FIG. 1 in accordance with some embodiments.
Figure 12:
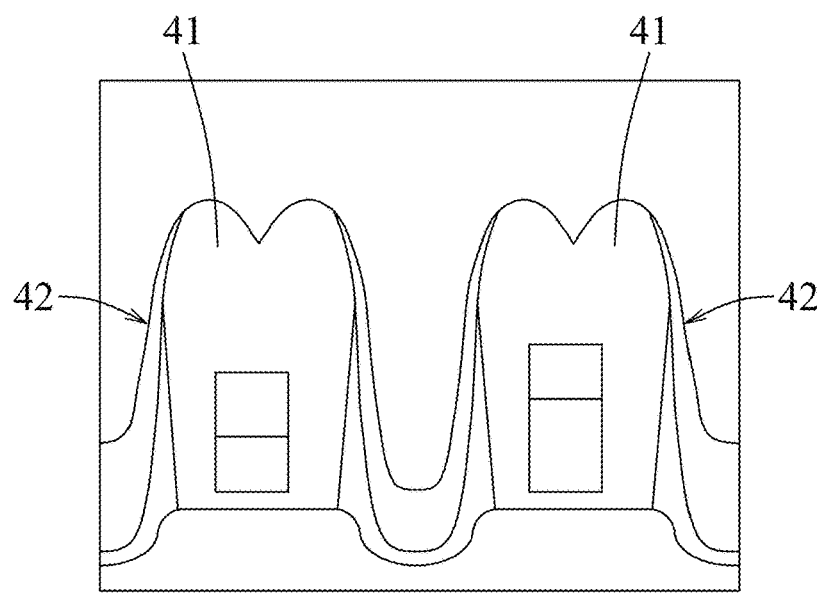

Referring to FIG. 10, which is a schematic view illustrating the manufacturing method in accordance with the some alternative embodiments in which the selective etching process is performed at the temperature ranging from about 90° C. to about 120° C., cycles of alternating the selective etching process and the cleaning process as described above are performed. The cleaning process involves a purging process performed using an inner gas (for example, but not limited to, a mixture of argon (Ar) and nitrogen ($N_2$)). Each cycle of the purging process may be performed for a time period ranging from about 10 seconds to about 60 seconds. The selective etching process may be performed for about 25 cycles to about 40 cycles, and each cycle of the selective etching process may be performed for a time period (i.e., the process window) ranging from about 2 seconds to about 5 seconds, as described above. The selective etching process and the purging process may be performed in a same chamber (i.e., chamber A). After completion of the last cycle of the purging process, an annealing process may be performed at a temperature ranging from 100° C. to 225° C. in another chamber (i.e., chamber B) to remove residue of the deposit. When the annealing process is performed at a temperature lower than 100° C., the residue of the deposit may not be removed effectively. When the annealing process is performed at a temperature higher than 225° C., the semiconductor device may be damaged, or a relatively long cooling period is required to cool the semiconductor device to a proper temperature for a subsequent processing procedure.

Figure 18:
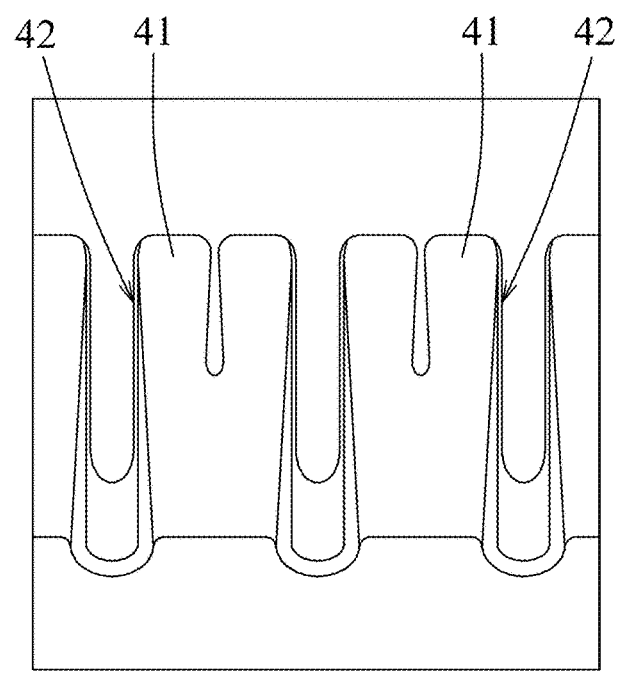
Figure 19:
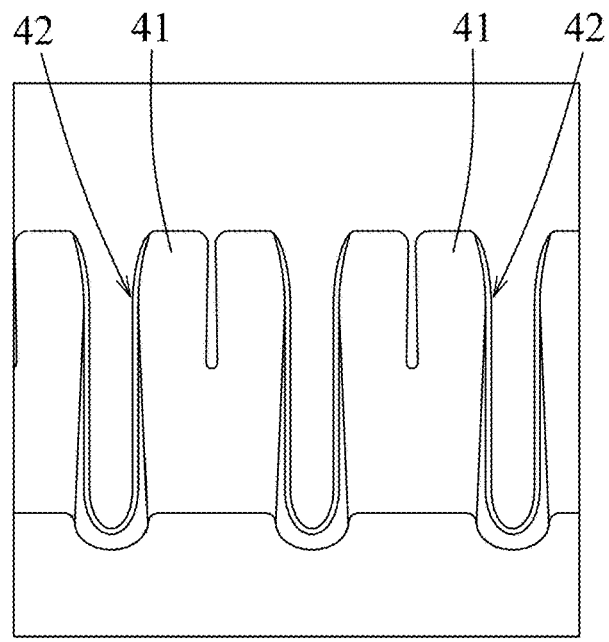
Figure 20:
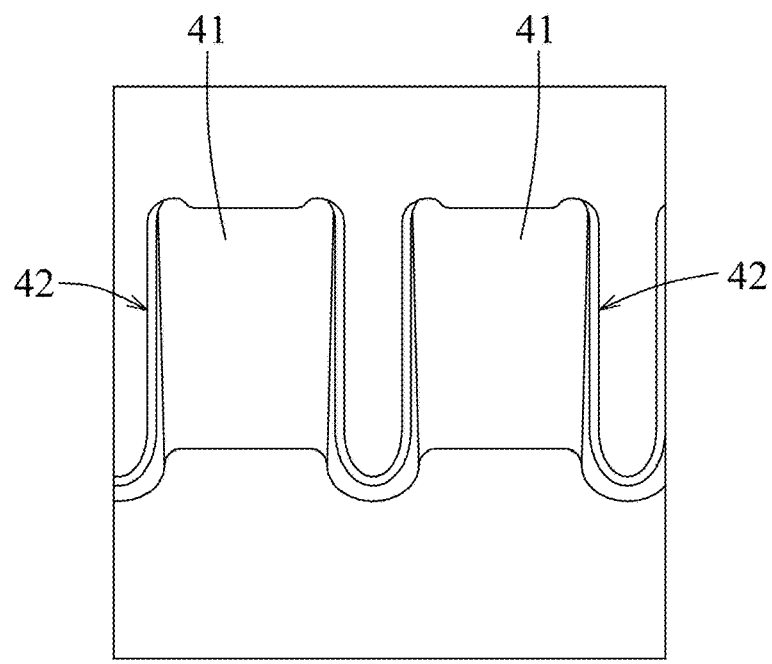

Each of FIGS. 16 to 20 illustrates a fragmentary enlarged view of the semiconductor device 200 shown in FIG. 3 in accordance with the some alternative embodiments in which the selective etching process is performed at the temperature ranging from about 90° C. to about 120° C. When the method as depicted in FIG. 1 in accordance with the some alternative embodiments is performed using operation conditions which includes an etching temperature ranging from about 90° C. to about 110° C., a flow rate of the hydrogen halide ranging from about 125 sccm to about 250 sccm, a flow rate of the nitrogen-containing compound ranging from about 75 sccm to about 250 sccm, a flow rate of the purging gas ranging from about 9000 sccm to about 12000 sccm, and an etching cycle ranging from about 2 seconds to about 5 seconds, the semiconductor devices 200 having the configurations shown in FIGS. 18 to 20 can be obtained. In comparison with the configurations shown in FIGS. 16 and 17, the loss and/or damage of the SACs 41 in the configurations shown in FIGS. 18 to 20 is relatively less, and the SACs 41 even may have a substantially intact configuration, as shown in FIG. 20.

Referring to FIG. 1, the method 100 then proceeds to block 130, where a plurality of via contacts are formed. Referring to the examples illustrated in FIGS. 3 and 4, the spacer layers 42 are removed by a suitable etching process known to those skilled in the art of semiconductor fabrication (for example, but not limited to, a wet etching process, a dry etching process, or a combination thereof) so as to expose corresponding ones of the source/drain regions 22 from the trenches 44. The first via contacts 51 are formed by depositing a metal material to fill the trenches 44, and then excess of the metal material is removed by a planarization technique, such as chemical mechanical planarization (CMP). The first via contacts 51 thus formed are electrically connected to the source/drain regions 22, respectively. Thereafter, a second via contact 52 is formed to be electrically connected to a corresponding one of the first via contacts 51, and a third via contact 53 is formed to be electrically connected to a cap layer 24 (for example, a fluorine-free tungsten film) disposed on the gate structure 23 of a corresponding one of the nanosheet FETs 2. The second and third via contacts 52, 53 may be formed independently or simultaneously by a damascene process, which includes the following steps. First, a via opening is formed through an ILD layer to expose a corresponding one of the first via contact 51 and the cap layer 24 from the via opening. After formation of the via opening, a metal material is filled into the via opening by a suitable deposition process known to those skilled in the art of semiconductor fabrication, for example, but not limited to, CVD, PECVD, ALD, PEALD, or other suitable deposition techniques, and then excess of the metal material above the ILD layer is removed by a planarization technique, such as CMP, so as to form the second via contact 52 and/or the third via contact 53. In some embodiments, the metal material for forming the first, second, and third via contacts 51, 52, 53 may include, for example, but not limited to, Ru, Co, Mo, W, Ni, Ir, Rh, Os, and the like, or combinations thereof.

In the method for manufacturing a semiconductor device of the present disclosure, a plasma-less etching process (a selective etching process) is introduced in which an etching composition having a high etching selectivity is used. The etchant composition has a high etching selectivity of a dielectric layer including silicon oxide to a feature including silicon, a dielectric material other than silicon oxide, or a combination thereof, so that trenches having a high aspect ratio may be formed substantially without lost and/or damage of the feature after the plasma-less etching process. A circuit shortage may not occur between interconnect structures (for example, via contacts) formed by filling a metal material into the trenches. An initial height pf poly-gates required for forming the trenches may be reduced. The plasma-less etching process using the etching composition having a high etching selectivity may be applied in front-end-of-line (FEOL), middle-end-of-line (MEOL), and/or back-end-of-line (BEOL) applications in which trenches having a high aspect ratio are formed in a dielectric layer including silicon oxide.

In accordance with some embodiments of the present disclosure, a method for manufacturing a semiconductor device includes:

forming a feature in a dielectric layer disposed on a semiconductor substrate, the dielectric layer including silicon oxide, the feature extending downwardly from a top surface of the dielectric layer and including silicon, a nitride compound, a low-k dielectric material other than silicon oxide, or combinations thereof; and selectively etching the dielectric layer using an etchant composition to form a trench extending downwardly from the top surface of the dielectric layer, the etchant composition including a hydrogen halide and a nitrogen-containing compound represented by Formula (A),

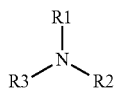

wherein
R1, R2, R3 are each independently hydrogen, methyl, or ethyl.

In accordance with some embodiments of the present disclosure, the method further includes, prior to selectively etching the dielectric layer, forming a spacer layer having a wall portion which extends downwardly from the top surface of the dielectric layer and which is disposed between the dielectric layer and the feature. The spacer layer includes a nitride compound, a low-k dielectric material other than silicon oxide, or a combination thereof.

In accordance with some embodiments of the present disclosure, the dielectric layer is selectively etched at a temperature ranging from 10° C. to 45° C.

In accordance with some embodiments of the present disclosure, the dielectric layer is selectively etched at a pressure ranging from 0.3 Torr to 3 Torr.

In accordance with some embodiments of the present disclosure, the hydrogen halide is supplied at a flow rate ranging from 5 sccm to 120 sccm.

In accordance with some embodiments of the present disclosure, the nitrogen-containing compound is supplied at a flow rate ranging from 25 sccm to 600 sccm.

In accordance with some embodiments of the present disclosure, the method further includes, after selectively etching the dielectric layer, annealing at a temperature ranging from 150° C. to 225° C. to remove a deposit produced by selectively etching the dielectric layer using the etchant composition.

In accordance with some embodiments of the present disclosure, the dielectric layer is selectively etched at a temperature ranging from 90° C. to 120° C.

In accordance with some embodiments of the present disclosure, the dielectric layer is selectively etched at a pressure ranging from 10 Torr to 30 Torr.

In accordance with some embodiments of the present disclosure, the hydrogen halide is supplied at a flow rate ranging from 120 sccm to 360 sccm.

In accordance with some embodiments of the present disclosure, the nitrogen-containing compound is supplied at a flow rate ranging from 60 sccm to 240 sccm.

In accordance with some embodiments of the present disclosure, the method further includes, after selectively etching the dielectric layer, purging using an inert gas to remove a deposit produced by selectively etching the dielectric layer using the etchant composition.

In accordance with some embodiments of the present disclosure, the method further includes, after purging, annealing at a temperature ranging from 100° C. to 225° C. to remove residual of the deposit.

In accordance with some embodiments of the present disclosure, a method for manufacturing a semiconductor device includes:
forming a spacer layer in a dielectric layer disposed on a semiconductor substrate, the dielectric layer including silicon oxide, the spacer layer including a nitride compound, a low-k dielectric material other than silicon oxide, or a combination thereof, and having a wall portion extending downwardly from a top surface of the dielectric layer; and selectively etching the dielectric layer using an etchant composition to form a trench extending downwardly from the top surface of the dielectric layer, the etchant composition having an etching selectivity of the dielectric layer to the spacer layer which ranges from 10 to 100 and including a hydrogen halide and a nitrogen-containing compound represented by Formula (A)

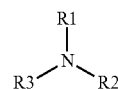

wherein
R1, R2, R3 are each independently hydrogen, methyl, or ethyl.

In accordance with some embodiments of the present disclosure, the method further includes, prior to selectively etching the dielectric layer, forming a feature in the dielectric layer. The feature is spaced apart from the dielectric layer by the wall portion of the spacer layer and extends downwardly from the top surface of the dielectric layer. The feature includes silicon, a nitride compound, a low-k dielectric material other than silicon oxide, or combinations thereof. The etchant composition has an etching selectivity of the dielectric layer to the feature ranging from 10 to 100.

In accordance with some embodiments of the present disclosure, a method for manufacturing a semiconductor device includes:
forming a self-aligned contact in a dielectric layer disposed on a semiconductor substrate, the dielectric layer including silicon oxide, the self-aligned contact extending downwardly from a top surface of the dielectric layer and being disposed on a gate structure, and including silicon, a nitride compound, a low-k dielectric material other than silicon oxide, or combinations thereof; and
selectively etching the dielectric layer using an etchant composition to form a trench for forming an interconnect structure to be electrically connected to a source/drain region in the semiconductor substrate, the etchant composition including a hydrogen halide and a nitrogen-containing compound represented by Formula (A),

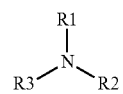

wherein
R1, R2, R3 are each independently hydrogen, methyl, or ethyl.

In accordance with some embodiments of the present disclosure, the method further includes, prior to selectively etching the dielectric layer, forming a spacer layer having a wall portion which extends downwardly from the top surface of the dielectric layer and which is disposed between the dielectric layer and the self-aligned contact. The spacer layer includes a nitride compound, a low-k dielectric material other than silicon oxide, or a combination thereof.

In accordance with some embodiments of the present disclosure, the dielectric layer is selectively etched at a temperature ranging from 90° C. to 120° C.

In accordance with some embodiments of the present disclosure, the hydrogen halide is supplied at a flow rate ranging from 120 sccm to 360 sccm, and the nitrogen-containing compound is supplied at a flow rate ranging from 60 sccm to 240 sccm.

In accordance with some embodiments of the present disclosure, the etchant composition further includes an inert diluent supplied at a flow rate ranging from 9000 sccm to 12000 sccm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
    forming a feature in a dielectric layer disposed on a semiconductor substrate, the dielectric layer including silicon oxide, the feature extending downwardly from a top surface of the dielectric layer and including silicon, a nitride compound, a low-k dielectric material other than silicon oxide, or combinations thereof; and
    selectively etching the dielectric layer using an etchant composition to form a trench extending downwardly from the top surface of the dielectric layer, the etchant composition including a hydrogen halide and a nitrogen-containing compound represented by Formula (A),

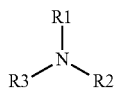
(A)

wherein
R1, R2, R3 are each independently hydrogen, methyl, or ethyl, and
wherein the method further comprises, prior to selectively etching the dielectric layer, forming a spacer layer having a wall portion which extends downwardly from the top surface of the dielectric layer and which is disposed between the dielectric layer and the feature, the spacer layer including a nitride compound, a low-k dielectric material other than silicon oxide, or a combination thereof.

2. The method according to claim 1, wherein the dielectric layer is selectively etched at a temperature ranging from 10° C. to 45° C.

3. The method according to claim 2, wherein the dielectric layer is selectively etched at a pressure ranging from 0.3 Torr to 3 Torr.

4. The method according to claim 2, wherein the hydrogen halide is supplied at a flow rate ranging from 5 sccm to 120 sccm.

5. The method according to claim 2, wherein the nitrogen-containing compound is supplied at a flow rate ranging from 25 sccm to 600 sccm.

6. The method according to claim 2, further comprising, after selectively etching the dielectric layer, annealing at a temperature ranging from 150° C. to 225° C. to remove a deposit produced by selectively etching the dielectric layer using the etchant composition.

7. The method according to claim 1, wherein the dielectric layer is selectively etched at a temperature ranging from 90° C. to 120° C.

8. The method according to claim 7, wherein the dielectric layer is selectively etched at a pressure ranging from 10 Torr to 30 Torr.

9. The method according to claim 7, wherein the hydrogen halide is supplied at a flow rate ranging from 120 sccm to 360 sccm.

10. The method according to claim 7, wherein the nitrogen-containing compound is supplied at a flow rate ranging from 60 sccm to 240 sccm.

11. The method according to claim 7, further comprising, after selectively etching the dielectric layer, purging using an inert gas to remove a deposit produced by selectively etching the dielectric layer using the etchant composition.

12. The method according to claim 11, further comprising, after purging, annealing at a temperature ranging from 100° C. to 225° C. to remove residual of the deposit.

13. A method for manufacturing a semiconductor device comprising:
    forming a spacer layer in a dielectric layer disposed on a semiconductor substrate, the dielectric layer including silicon oxide, the spacer layer including a nitride compound, a low-k dielectric material other than silicon oxide, or a combination thereof, and having a wall portion extending downwardly from a top surface of the dielectric layer; and
    selectively etching the dielectric layer using an etchant composition to form a trench extending downwardly from the top surface of the dielectric layer, the etchant composition having an etching selectivity of the dielectric layer to the spacer layer which ranges from 10 to 100 and including a hydrogen halide and a nitrogen-containing compound represented by Formula (A)

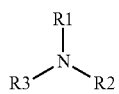
(A)

wherein
R1, R2, R3 are each independently hydrogen, methyl, or ethyl,
wherein the method further comprises, prior to selectively etching the dielectric layer, forming a feature in the dielectric layer, the feature being spaced apart from the dielectric layer by the wall portion of the spacer layer and extending downwardly from the top surface of the dielectric layer, the feature including silicon, a nitride compound, a low-k dielectric material other than silicon oxide, or combinations thereof, the etchant composition having an etching selectivity of the dielectric layer to the feature ranging from 10 to 100.

14. The method according to claim 13, further comprising, after selectively etching the dielectric layer, annealing at a temperature ranging from 150° C. to 225° C. to remove a deposit produced by selectively etching the dielectric layer using the etchant composition.

15. The method according to claim 13, further comprising, after selectively etching the dielectric layer, purging using an inert gas to remove a deposit produced by selectively etching the dielectric layer using the etchant composition.

16. A method for manufacturing a semiconductor device comprising:
forming a self-aligned contact in a dielectric layer disposed on a semiconductor substrate, the dielectric layer including silicon oxide, the self-aligned contact extending downwardly from a top surface of the dielectric layer and being disposed on a gate structure, and including silicon, a nitride compound, a low-k dielectric material other than silicon oxide, or combinations thereof; and
selectively etching the dielectric layer using an etchant composition to form a trench for forming an interconnect structure to be electrically connected to a source/drain region in the semiconductor substrate, the etchant composition including a hydrogen halide and a nitrogen-containing compound represented by Formula (A),

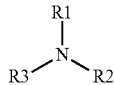
(A)

wherein
R1, R2, R3 are each independently hydrogen, methyl, or ethyl.

17. The method according to claim 16, further comprising, prior to selectively etching the dielectric layer, forming a spacer layer having a wall portion which extends downwardly from the top surface of the dielectric layer and which is disposed between the dielectric layer and the self-aligned contact, the spacer layer including a nitride compound, a low-k dielectric material other than silicon oxide, or a combination thereof.

18. The method according to claim 16, wherein the dielectric layer is selectively etched at a temperature ranging from 90° C. to 120° C.

19. The method according to claim 18, wherein the hydrogen halide is supplied at a flow rate ranging from 120 sccm to 360 sccm and the nitrogen-containing compound is supplied at a flow rate ranging from 60 sccm to 240 sccm.

20. The method according to claim 19, wherein the etchant composition further includes an inert diluent supplied at a flow rate ranging from 9000 sccm to 12000 sccm.

* * * * *